United States Patent [19]
Majumdar et al.

[11] Patent Number: 5,773,883
[45] Date of Patent: Jun. 30, 1998

[54] SEMICONDUCTOR DEVICE AND SEMICONDUCTOR MODULE

[75] Inventors: Gourab Majumdar; Satoshi Mori; Sukehisa Noda; Tooru Iwagami; Yoshio Takagi; Hisashi Kawafuji, all of Tokyo, Japan

[73] Assignee: Mitsubishi Denki Kabushiki Kaisha, Tokyo, Japan

[21] Appl. No.: 663,407

[22] Filed: Jun. 13, 1996

[30] Foreign Application Priority Data

Jan. 9, 1996 [JP] Japan ..................................... 8-001581

[51] Int. Cl.⁶ ............................. H01L 23/48; H01L 23/34
[52] U.S. Cl. ........................................ 257/698; 257/717
[58] Field of Search ................................... 257/717, 698, 257/658, 692, 693

[56] References Cited

U.S. PATENT DOCUMENTS 5,077,595 12/1991 Fukunaga ................................. 257/717
5,099,138 3/1992 Fukunaga ................................. 307/248
5,296,735 3/1994 Fukunaga ................................. 257/659
5,347,160 9/1994 Satrina ..................................... 257/698

FOREIGN PATENT DOCUMENTS 7-250485 9/1995 Japan.

Primary Examiner—Donald Monin
Attorney, Agent, or Firm—Oblon, Spivak, McClelland, Maier & Neustadt, P.C.

[57] ABSTRACT

In a device (101) formed as an invertor, terminals connected to floating source pins (VS) which are provided in control circuits (31 to 33) are limited to output terminals (U, V, W). In order to hold voltages across floating source pins (VD, VS), capacitive elements (51 to 53) which are provided around the device (101) are connected to the output terminals (U, V, W). Thus, the terminals which are connected with the floating source pins (VS) are shared by the output terminals (U, V, W), whereby the numbers of the terminals and wiring patterns are reduced. Thus, the device (101) is miniaturized.

10 Claims, 7 Drawing Sheets

SEMICONDUCTOR DEVICE AND SEMICONDUCTOR MODULE

BACKGROUND OF THE INVENTION

1. Field of the Invention

The present invention relates to a semiconductor device comprising a pair of switching semiconductor elements which are connected in series with each other to alternately conduct and be cut off, and a semiconductor module which is formed by building such a semiconductor device into a circuit substrate, and more particularly, it relates to an improvement for miniaturizing a semiconductor device.

2. Description of the Background Art

Figure 8:
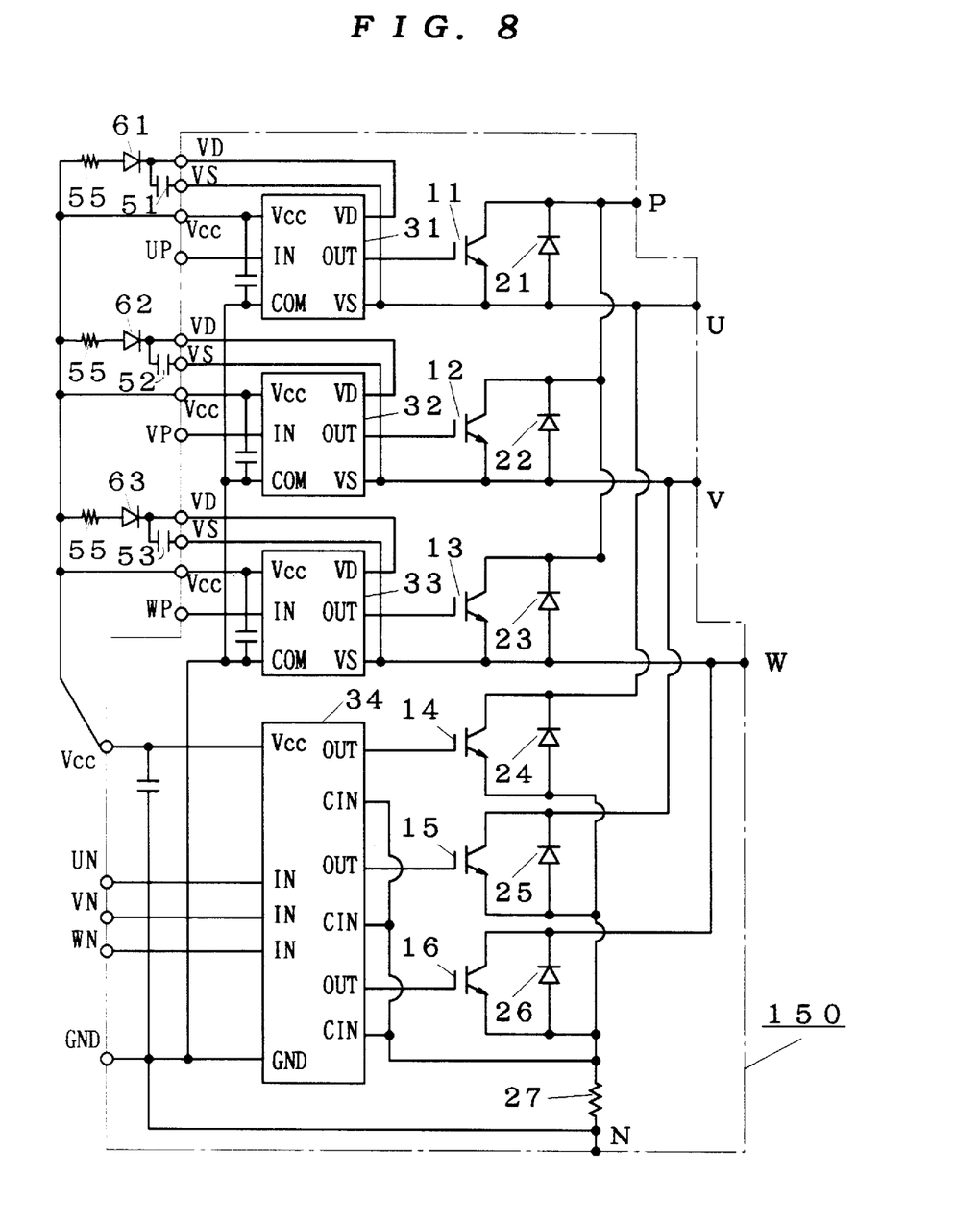
FIG. 8 is a circuit diagram of a conventional semiconductor device.

FIG. 8 is a circuit diagram showing the structure of a conventional semiconductor device forming the background of the present invention. This device 150 is formed as a three-phase invertor. The device 150 comprises IGBTs 11 to 16 serving as power switching elements. Series circuits of the IGBTs 11 and 14, the IGBTs 12 and 15, and the IGBTs 13 and 15 are inserted between power source terminals P and N which are connected with an external dc power source, to be parallel to each other. A current sensing resistive element 27 having a small resistance value is interposed between emitter electrodes of the IGBTs 14 to 16 and the power source terminal N.

The nodes of the pairs of IGBTs forming the respective series circuits are connected to output terminals U, V and W which are connected with an internal three-phase load respectively. Freewheel diodes 21 to 26 are connected in parallel with the IGBTs 11 to 16 respectively for protecting the IGBTs 11 to 16 against breakage caused by reverse currents.

Control circuits 31 to 33 are connected to the P-side IGBTs 11 to 13 respectively. Similarly, a control circuit 34 is connected to the N-side IGBTs 14 to 16. These control circuits 31 to 34 receive external signals which are independently inputted in six signal input terminals UP, VP, WP, UN, VN and WN provided in the device 150 through signal input pins IN, and output voltage signals for driving the IGBTs 11 to 16 through signal output pins OUT in response to the signals respectively. The control circuit 34 also has a function of cutting off the IGBTs 14 to 16 when an excessive load current flows, on the basis of a voltage drop across the resistive element 27 which is inputted to sense signal pins CIN.

The external signals are so inputted as to alternately turn on (allow conduction) and off (cut off) the pairs of IGBTs belonging to the three series circuits respectively. Consequently, the potentials of the output terminals U, V and W are transitted between high and low potentials which are supplied to the power source terminals P and N respectively. Further, the external signals are so inputted that the output terminals U, V and W are out of phase from each other by 120°. Consequently, the output terminals U, V and W output three-phase voltages and currents.

The control circuits 31 to 34 operate by power which is supplied across high potential side source pins Vcc and low potential side source pins COM and GND. The device 150 further comprises four control source terminals Vcc which are directly connected to the source pins Vcc of the control circuits 31 to 34 respectively, and a single control terminal GND which is connected to the four source pins COM and GND in common. The external dc power source is connected to the four control source terminals Vcc and the control terminal GND.

The control circuits 31 to 33 further comprise floating source pins VD and VS, which are further pairs of source pins, since it is necessary to transmit voltage signals based on the potentials of the output terminals U, V and W to gate electrodes of the IGBTs 11 to 13. The three floating source pins VS are connected to the output terminals U, V and W respectively. The device 150 further comprises three pairs of floating source terminals VD and VS which are connected to the three pairs of floating source pins VD and VS respectively.

The three floating source terminals VD are connected to the control source terminals Vcc through diode elements 61 to 63 which are provided in the exterior of the device 150 and resistive elements 55 which are connected in series thereto respectively. Further, capacitive elements 51 to 53 are interposed between the three pairs of floating source terminals VD and VS respectively in the exterior of the device 150. When the potentials of the output terminals U, V and W drop to that of the power source terminal N, the capacitive element 51 to 53 are charged through conduction of the diode elements 61 to 63 respectively. The capacitive elements 51 to 53 are adapted to hold voltages across the floating source pins VD and VS of the control circuits 31 to 33 at values exceeding a prescribed value over a period up to a next charging period.

As hereinabove described, the three floating source terminals VS are provided independently of the output terminals U, V and W in the conventional device 150, although the former are at the same potentials as the latter. The three floating source terminals VS are connected with the output terminals U, V and W respectively through wiring patterns in the interior of the device 150.

However, an area which is necessary for providing these floating source terminals VS and the wiring patterns in the device has an unnegligible magnitude, and hence the dimensions of the conventional device 150 are disadvantageously large. Particularly in a device which is formed by fixing various types of elements to lead frames forming terminals and wiring patterns and sealing the same with resin, the aforementioned problem remarkably appears since the areas of the lead frames immediately define the area of the device.

SUMMARY OF THE INVENTION

According to a first aspect of the present invention, a semiconductor device comprises first and second switching semiconductor elements which are connected in series with each other, first and second driving circuits for independently and respectively driving the first and second switching semiconductor elements, which are so formed that a first one of a pair of source electrodes provided in the first driving circuit is connected to a connecting part for the first and second switching semiconductor elements, and a plurality of terminals which are connectable with an external device, while the plurality of terminals include a first terminal which is connected to a second one of the pair of source electrodes and a second terminal which is connected to the connecting part, with inclusion of no terminal connected to the first one of the source electrodes except for the second terminal.

In a semiconductor device having a plurality of unit semiconductor devices according to a second aspect of the present invention, each of the plurality of unit semiconductor devices comprises first and second switching semiconductor elements which are connected in series with each other, first and second driving circuits independently and respectively driving the first and second switching semiconductor elements, and a plurality of terminals which are connectable with an external device, while a first one of a pair of source electrodes provided in the first driving circuit is connected to a connecting part for the first and second switching semiconductor elements, the plurality of terminals include a first terminal which is connected to a second one of the pair of source electrodes and a second terminal which is connected to the connecting part, with inclusion of no terminal connected to the first one of the source electrodes except for the second terminal, and main electrodes of the first and second switching semiconductor elements excluding the connecting part are connected in parallel with each other among the plurality of unit semiconductor devices.

According to a third aspect of the present invention, the semiconductor device further comprises an electrically conductive lead frame, which is in the form of a plate having a pattern shape, having the first and second switching semiconductor elements and the first and second driving circuits which are fixed thereto and including the plurality of terminals in its peripheral portion as parts thereof, and a sealing body sealing the first and second switching semiconductor elements and the first and second driving circuits along with the lead frame to expose the plurality of terminals.

According to a fourth aspect of the present invention, both of the first and second switching semiconductor elements are insulated gate switching semiconductor elements.

In a semiconductor module having a circuit substrate having wiring patterns, a semiconductor device, which is loaded on the circuit substrate, and a plurality of circuit elements which are further loaded on the circuit substrate according to a fifth aspect of the present invention, the semiconductor device comprises first and second switching semiconductor elements which are connected in series with each other, first and second driving circuits independently driving the same, and a plurality of terminals which are connectable with an external device, while a first one of a pair of source electrodes provided in the first driving circuit is connected to a connecting part for the first and second switching semiconductor elements, the plurality of terminals include a first terminal which is connected to a second one of the pair of source electrodes and a second terminal which is connected to the connecting part, with inclusion of no terminal connected to the first one of the source electrodes except for the second terminal, the plurality of terminals further include third and fourth terminals which are connected to a pair of source electrodes provided in the second driving circuit respectively, and the plurality of circuit elements include a capacitive element which is interposed between the first and second terminals, and a diode element which is interposed between the third and first terminals in such a direction that a forward current charges the capacitive element.

According to a sixth aspect of the present invention, the plurality of circuit elements further include a resistive element which is connected in series with the diode element.

In the device according to the first aspect of the present invention, a terminal relaying the first one of the pair of source electrodes of the first driving circuit with the external device is shared by the second terminal which is connected to the connecting part for the first and second switching semiconductor elements. Therefore, the number of the terminals is reduced as compared with the conventional device, whereby the number of internal wiring patterns is also reduced. Thus, miniaturization of the device is implemented.

The device according to the second aspect comprises the plurality of unit semiconductor devices each having the same structure as the device according to the first aspect, while the series circuits of the first and second switching semiconductor elements belonging thereto are connected in parallel with each other, thereby operating as single-phase or multiphase investors. Further, miniaturization of the device is implemented similarly to the first aspect.

In the device according to the third aspect, various elements and various circuits are fixed to the lead frame having a pattern shape while this lead frame forms a plurality of terminals, whereby reduction of the numbers of the terminals and wiring patterns brings reduction of the area of the lead frame. Since the area of the lead frame directly defines the size of the device, miniaturization of the device remarkably appears.

In the device according to the fourth aspect, the first and second switching semiconductor elements are insulated gate switching semiconductor elements which are voltage control types, whereby the first and second driving circuits are simplified in structure. Further, current consumption of these driving circuits is suppressed, whereby the capacitance of an external capacitive element which is connected to the pair of source electrodes of the first driving circuit can be suppressed in particular.

The module according to the fifth aspect comprises the semiconductor device of the first aspect while this device further comprises the third and fourth terminals, whereby a source voltage of the first driving circuit is regularly maintained by connecting a dc power source to the third and fourth terminals. Further, the circuit substrate which is loaded with the device is further loaded with the capacitive element interposed between the first and second terminals, while the diode element is further interposed between the third and first terminals.

When the potential of the second terminal is changed following ON/OFF operations of the first and second switching semiconductor elements, therefore, the capacitive element is charged by conduction of the diode element. The source voltage of the first driving circuit is maintained by the capacitive element over a constant period. Therefore, the source voltage of the first driving circuit is regularly held at a necessary level by properly setting the capacitance of the capacitive element. Namely, the operations of the first and second driving circuits are regularly maintained correct.

In the semiconductor device, only the second terminal is connected with the first one of the pair of source electrodes of the first driving circuit, and an end of the capacitive element which is loaded on the circuit substrate is connected to the second terminal. It is not necessary to widen the area of the circuit substrate due to the capacitive element and the wiring pattern connected thereto, as compared with the device of providing a terminal independently of the second terminal so that an end of the capacitive element is connected to this terminal. Following reduction of the size of the semiconductor device, therefore, the area of the circuit substrate is also reduced as such. Namely, miniaturization of the module is also implemented.

In the module according to the sixth aspect, the resistive element is connected in series with the diode element, whereby a current can be prevented from being excessive in conduction of the diode element. Namely, the diode element and the capacitive element can be protected against breakage and life reduction caused by an excess current.

Accordingly, an object of the present invention is to provide a semiconductor which is miniaturized by simplifying wiring patterns, and a semiconductor module into which the semiconductor device is built.

The foregoing and other objects, features, aspects and advantages of the present invention will become more

DESCRIPTION OF THE PREFERRED EMBODIMENTS

Embodiment 1

Figure 1:
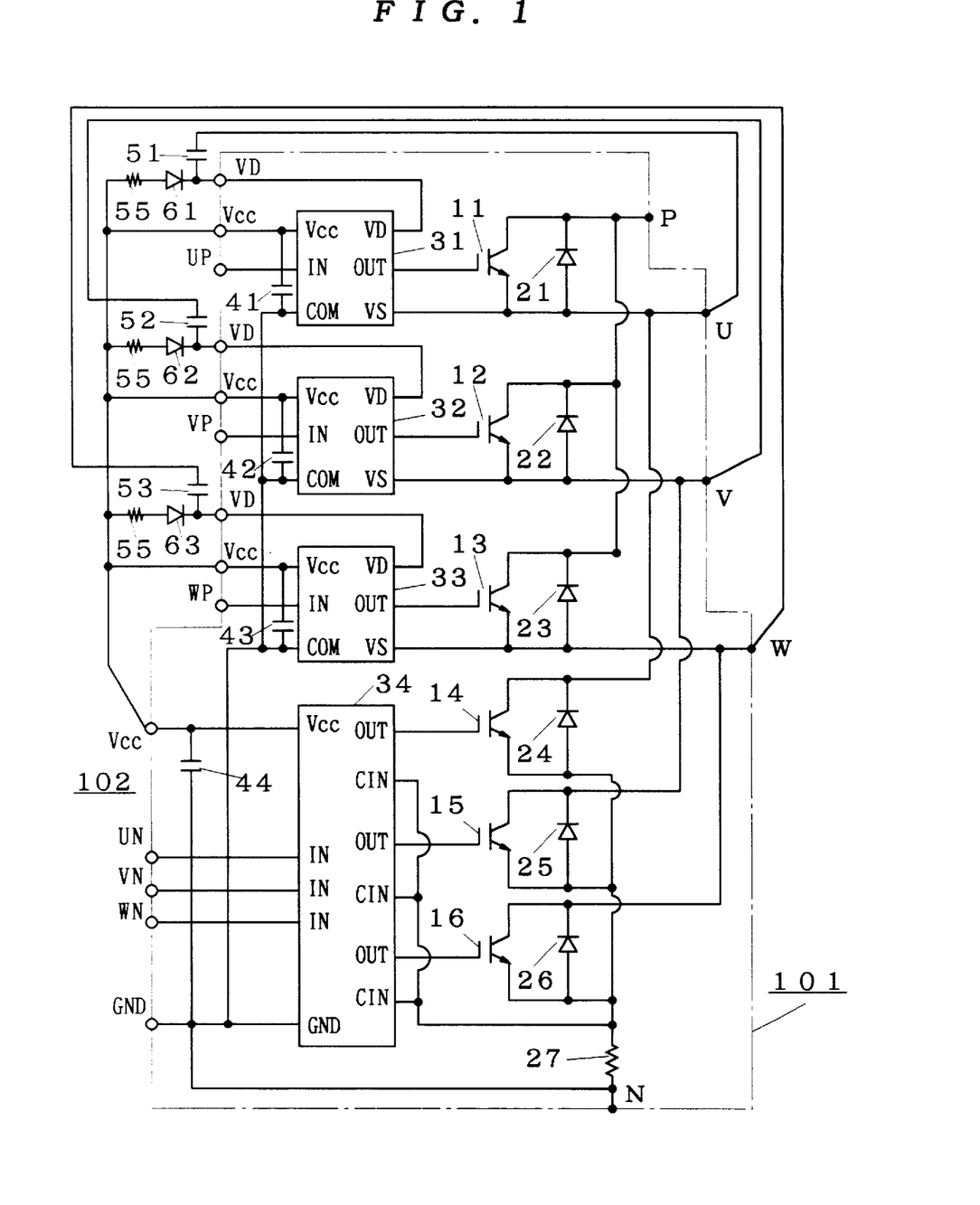
FIG. 1 is a circuit diagram of a semiconductor device according to an embodiment 1 of the present invention.

FIG. 1 is a circuit diagram showing the structure of a semiconductor device according to an embodiment 1. This device 101 is formed as a three-phase invertor. FIG. 1 also illustrates a principal part of a peripheral circuit to be connected with the device 101. The peripheral circuit and the device 101 form a semiconductor module 102 which is described later in detail.

As shown in FIG. 1, the device 101 comprises IGBTs 11 to 16 serving as power switching elements. The IGBTs 11 and 14 form a first series circuit, while second and third series circuits are similarly formed by the IGBTs 12 and 15 and the IGBTs 13 and 16 respectively.

These first to third series circuits are connected in parallel with each other, and interposed between a pair of power source terminals P and N which are connected to an external dc power source. Namely, collector electrodes of the P-side IGBTs (each being first switching semiconductor element) 11 to 13 are connected to the power source terminal P of a high potential side, while emitter electrodes of the N-side IGBTs (each being second switching semiconductor element) 14 to 16 are coupled to the power source terminal N of a low potential side. A sensing resistive element 27 is interposed between the emitter electrodes of the IGBTs 14 to 16 and the power source terminal N. The resistance value of the resistive element 27 is set at a sufficiently low value, so that a voltage drop caused across the resistive element 27 is unnegligibly reduced as compared with a dc voltage across the power source terminals P and N.

The node between the two IGBTs forming the first series circuit, i.e., the node between the emitter electrode of the IGBT 11 and the collector electrode of the IGBT 14, is connected to an output terminal (the second terminal) U. Similarly, the nodes between the pairs of IGBTs forming the second and third series circuits are connected to output terminals (each being the second terminal) V and W respectively. Namely, the first to third series circuits take charge of singles ones of three phases respectively, and serve functions of independently switching dc power currents which are supplied through the power source terminals P and N and outputting the same through the output terminals U, V and W respectively. The output terminals U, V and W are connected with an external three-phase load such as a three-phase motor, for example.

Freewheel diodes 21 to 26 are connected in series with the IGBTs 11 to 16 respectively. These freewheel diodes 21 to 26 are adapted to protect the IGBTs 11 to 16 against breakage by reverse currents respectively.

Control circuits 31 to 33 are connected to the P-side IGBTs 11 to 13 respectively. Similarly, a control circuit 34 is connected to the N-side IGBTs 14 to 16. These control circuits 31 to 34 are adapted to independently drive the IGBTs 11 to 16 in response to external signals which are independently inputted to six signal input terminals UP, VP, WP, UN, VN and WN provided in the device 101 respectively.

Namely, the control circuits 31 to 34 output gate voltages for turning on or off the IGBTs 11 to 16 through signal output pins OUT, in response to the external signals which are inputted to signal input pins IN through the signal input terminals UP, VP, WP, UN, VN and WN. Gate electrodes of the IGBTs 11 to 16 are connected to the signal output pins OUT.

The external signals are so inputted as to alternately turn on and off the pairs of IGBTs belonging to the first to third series circuits respectively. Following this, the potentials of the output terminals U, V and W are transitted between the potentials of the power source terminals P and N. Further, the external signals are so inputted that the output terminals U, V and W are out of phase from each other by 120°. Consequently, the output terminals U, V and W output three-phase voltages and currents.

The device 101 further comprises four control source terminals (each being the third terminal) Vcc of the high potential side and a control source terminal (the fourth terminal) GND of the low potential side which is paired with the same, independently of the power source terminals P and N connected with the external power source. The four control source terminals Vcc are independently connected to high-potential side source pins Vcc of the four control circuits 31 to 34 respectively, while the control source terminal GND is connected to low-potential side source pins COM and GND of the control circuits 31 to 34 in common.

The four control source terminals Vcc are connected with each other through wiring patterns forming parts of the peripheral circuit. The external dc power source is connected to the control source terminals Vcc and the control source terminal GND. Consequently, the voltage and the current outputted from the dc power source is directly supplied to the control circuits 31 to 34.

Capacitive elements 41 to 44 for suppressing voltage fluctuation are connected between the respective source pins Vcc and the source pins COM and GND of the control circuits 31 to 34. Among the four control circuits 31 to 34, the control circuits 31 to 33 for controlling the P-side IGBTs 11 to 13 comprise additional pairs of floating source pins (source electrodes) VD and VS, in addition to the pairs of source pins Vcc and COM. Namely, each of the control circuits 31 to 33 requires two systems of power sources.

The device 101 further comprises three floating source terminals (each being the first terminal) VD which are directly coupled to the floating source pins VD of the control circuits 31 to 33 respectively. These three floating source terminals VD are connected to the control source terminals Vcc through diode elements 61 to 63 which are included in the peripheral circuit and resistive element 55 which are connected in series thereto respectively, and simultaneously connected to the output terminals U, V and W through capacitive elements 51 to 53 which are included in the peripheral circuit respectively. Further, floating source pins VS of the control circuits 31 to 33 are directly coupled to the output terminals U, V and W respectively in the interior of the device 101.

Figure 2:
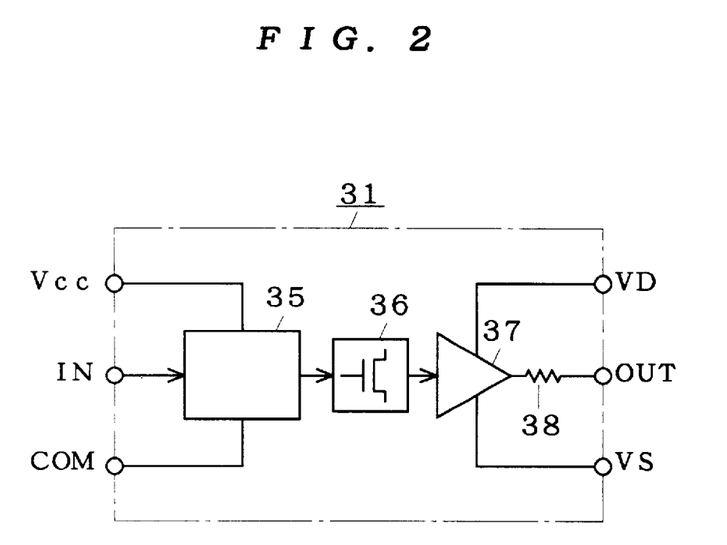
FIG. 2 is a circuit diagram of a control circuit shown in FIG. 1.

FIG. 2 illustrates the internal structure of the control circuit 31, as the representative of the control circuits 31 to 33. The control circuit 31 is formed by a single semiconductor chip, so that a pulse generation circuit 35 which operates by power supplied through the source pins Vcc and COM, a driving circuit (first driving circuit) 37 which operates by power supplied through the floating source pins VD and VS, a level shifter 36 which relays the same, and a gate resistive element 38 which is connected to an output of the driving circuit 37 are built into this semiconductor chip.

The pulse generation circuit 35 outputs a pulse signal of a level based on the potentials of the source pins Vcc and COM, in response to the external signal inputted to the signal input pin IN which is directly coupled to the signal input terminal UP. This pulse signal is level-shifted by the level shifter 36, and inputted to the driving circuit 37. The driving circuit 37 outputs a gate voltage which is based on the potential of the floating source pin VS in response to the inputted pulse signal. This gate voltage is transmitted to the signal output pin OUT through the gate resistive element 38.

As hereinabove described, the potentials of the output terminals U, V and W vary following ON/OFF operations of the IGBTs 11 to 16. The floating source pins VS of the control circuits 31 to 33 are connected to the output terminals U, V and W respectively, whereby the potential forming the basis of each driving circuit 37 varies with respect to the potential forming the basis of each pulse generating circuit 35. Thus, the pulse generation circuit 35 and the driving circuit 37 are built into two islands which are electrically insulated from each other in the single semiconductor chip. Due to variation in the reference potential of the driving circuit 37, the level shifter 36 for level adjustment is interposed between the pulse generation circuit 35 and the driving circuit 37.

Referring again to FIG. 1, the diode element 61 conducts when the potential of the output terminal U drops to that of the power source terminal N due to operations of the IGBTs 11 and 14 entering OFF and ON states respectively. At this time, a current which is limited by the resistive element 55 flows into the capacitive element 51, thereby charging the capacitive element 51. The remaining capacitive elements 52 and 53 are similarly charged when the potentials of the output terminals V and W drop to that of the power source terminal N respectively.

The capacitive element 51 to 53 are adapted to hold the voltages across the floating source pins VD and VS of the control circuits 31 to 33 at values exceeding a prescribed value over a period up to a next charging period. Consequently, the control circuits 31 to 33 can regularly maintain correct operations.

The control circuit 34 for driving the N-side IGBTs 14 to 16 comprises three sense signal pins CIN. Nodes between the IGBTs 14 to 16 and the resistive element 27 are connected to the sense signal pins CIN.

Figure 3:
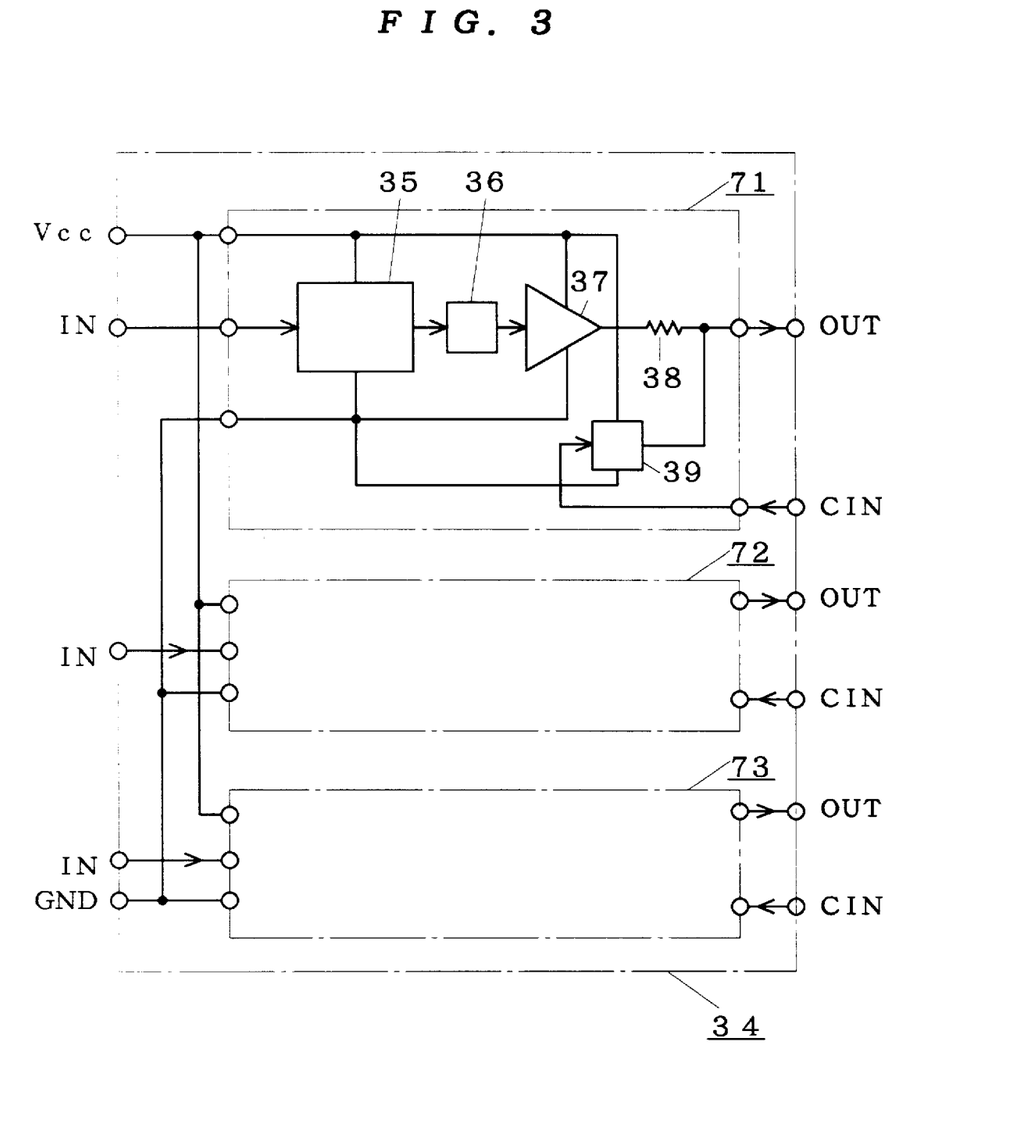
FIG. 3 is a circuit diagram of another control circuit shown in FIG. 1.

FIG. 3 is a circuit diagram showing the internal structure of the control circuit 34. This control circuit 34 is also formed by a single semiconductor chip. Three circuit parts 71 to 73 for independently driving the three IGBTs 14 to 16 respectively are built into this semiconductor chip. Referring to the circuit part 71 serving as the representative, for example, this circuit part 71 further comprises an overcurrent protection circuit 39, in addition to parts of the same structure as the control circuit 31.

When the potential difference between the potential which is inputted to the sense signal pin CIN and that of the source pin GND exceeds a certain reference value, the overcurrent protection circuit 39 reduces the output voltage of the signal output pin OUT, i.e., the gate voltage of the IGBT 14, to zero or a negative value, regardless of the output of the driving circuit (second driving circuit) 37. Consequently, the IGBT 14 is turned off, regardless of the value of the external signal which is inputted to the signal input terminal UN.

The potential difference between the sense signal pin CIN and the source pin GND coincides with the magnitude of the voltage drop which is caused across the resistive element 27. The voltage drop which across caused in the resistive element 27 is proportionate to the magnitude of the current flowing through the resistive element 27, i.e., that of the current flowing through the load. Thus, such overcurrent protection circuits 39 are adapted to cut off the IGBTs 14 to 16 when the load current becomes excessive beyond the certain reference value, thereby preventing the IGBTs 11 to 16 from breakage, i.e., protecting the device 101 against breakage caused by an overload current.

Referring again to FIG. 1, the capacitive elements 51 to 53 are interposed between the floating source terminals VD connected to the control circuits 31 to 33 and the output terminals U, V and W as described above, and the floating source terminals VS which have been provided in the conventional device 150 are removed. In other words, the three floating source terminals VS and the output terminals U, V and W are in common with each other in the device 101. Following this, wiring patterns which have been arranged in the conventional apparatus 150 for connecting the three floating source terminals VS and the output terminals U, V and W are also removed. Consequently, the area required for such wiring patterns and floating source terminals VS is reduced in the device, whereby the device 101 is miniaturized as compared with the conventional device 150.

Figure 4:
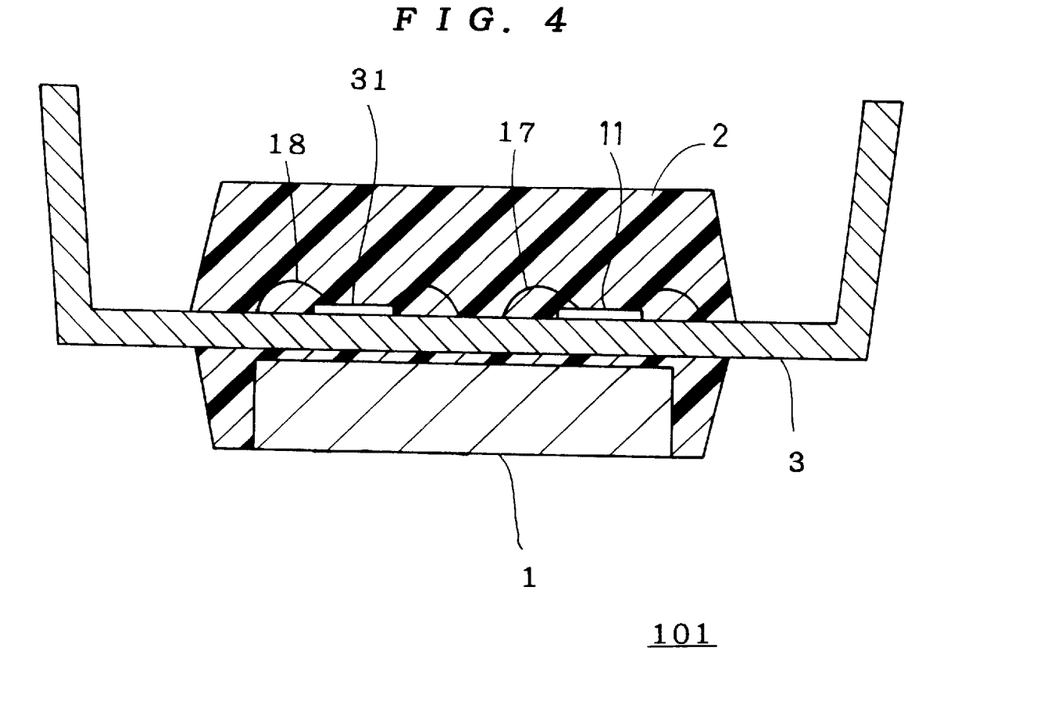
FIG. 4 is a front sectional view of the device shown in FIG. 1.

FIG. 4 is a front sectional view showing an exemplary structure of the device 101. In this example, the device 101 is formed as the so-called DIP type device. In the device 101, circuit elements such as the IGBTs 11 to 16 and the control circuits 31 to 34 are soldered to a plurality of portions on a plate-type lead frame 3 of copper having a prescribed pattern shape.

These elements are further connected to different portions of the lead frame 3 through a bonding wire 17 of aluminum, a bonding wire 18 of gold and the like, for example. Among the elements, the IGBT 11 and the control circuit 31 appear in FIG. 4. The lead frame 3 forms the wiring patterns of the device 101, while also forming an externally projecting terminal.

The device 101 is further provided with a plate-type heat sink 1, to be opposed to a major surface of the lead frame 3 which is opposite to that provided with the elements with a clearance (gap). Electric insulating sealing resin 2 seals parts of the lead frame 3 excluding the terminal, the various elements loaded thereon, and the heat sink 1. The sealing resin 2 further fills up the clearance between the lead frame 3 and the heat sink 1, thereby thermally coupling the lead frame 3 and the heat sink 1 with each other while electrically insulating the same from each other.

As hereinabove described, the floating source terminals VS as well as the wiring patterns connecting the floating source terminals VS with the output terminals U, V and W are removed, whereby such floating source terminals VS and wiring patterns may not be formed by the lead frame 3. Thus, the area of the lead frame 3 is reduced. Consequently, the device 101 is miniaturized. The area of the lead frame 3 directly defines the size of the overall device 101, whereby an effect of reducing the dimensions of the device 101 remarkably appears in the device 101.

Embodiment 2

Figure 5:
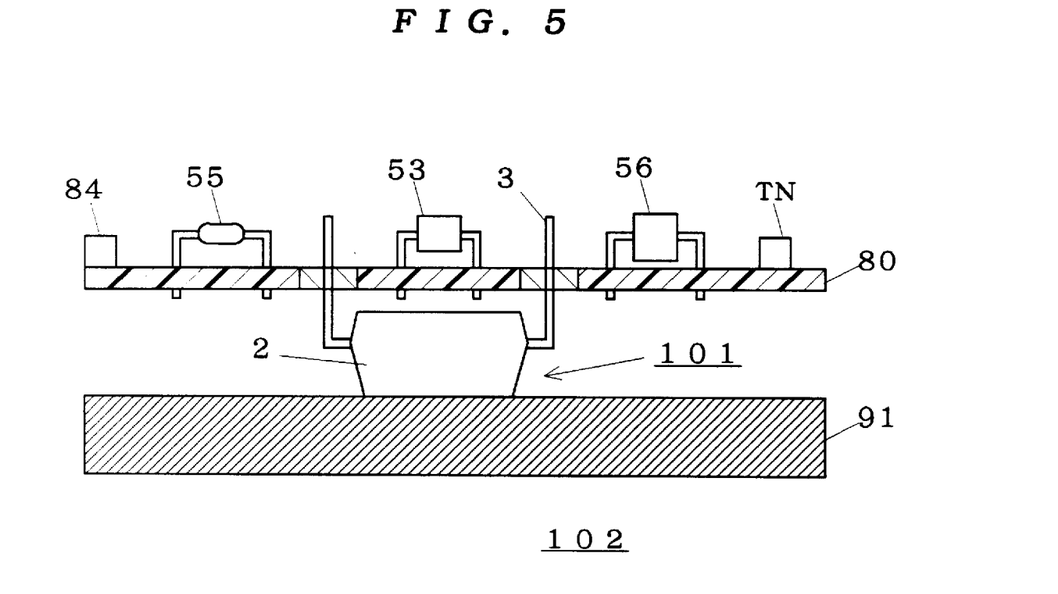
FIG. 5 is a front sectional view of a semiconductor module according to an embodiment 2 of the present invention.
Figure 6:
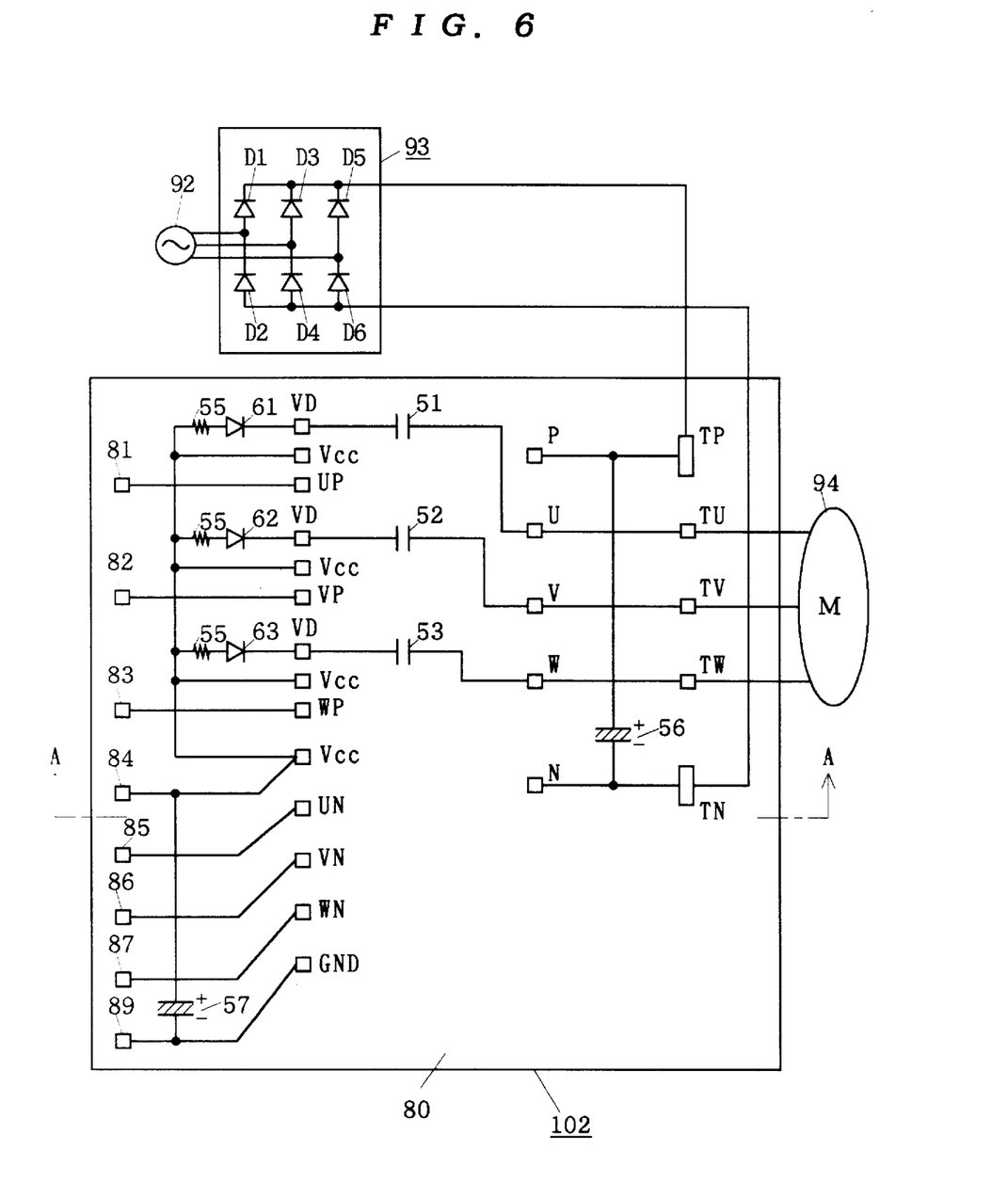
FIG. 6 is a wiring diagram of the module shown in FIG. 5.

A semiconductor module 102 which is formed by building the device 101 into a circuit substrate is now described. FIGS. 5 and 6 are a sectional view and a wiring diagram of the module 102 respectively. FIG. 5 corresponds to a sectional view taken along the line A—A in FIG. 6.

As shown in these figures, the module 102 comprises a circuit substrate 80, and the device 101 is fixed to a prescribed portion of this circuit substrate 80. A radiating fin 91 which is made of a heat conductive material such as aluminum is fixed to the device 101, to be in contact with the heat sink 1. Heat loss which is caused in the IGBTs 11 to 16 is transmitted from the heat sink 1 to the radiating fin 91, to be efficiently radiated to the exterior.

The various circuit elements which are included in the peripheral circuit of the device 101 described with reference to FIG. 1 are loaded on a major surface of the circuit substrate 80 which is opposite to that provided with the device 101 and the radiating fin (radiating means) 91. The circuit substrate 80 is provided on its both major surfaces with wiring patterns, which properly connect the pins of the various circuit elements loaded on the circuit substrate 80 and the various terminals of the device 101 formed by the lead frame 3. FIG. 6 typically illustrates wiring patterns which are arranged on the circuit substrate 80 in solid lines.

The circuit substrate 80 is further provided with external terminals 81 to 89, TP, TN, TU, TV and TW relaying the external device and the device 101 with each other. Among these, the external terminals 81 to 83 and 85 to 87 are adapted to relay an external signal input device with the signal input terminals UP, VP, WP, UN, VN and WN. On the other hand, the external terminals 84 and 89 are adapted to relay an external control power source and the control source terminals Vcc and GND with each other. Further, the external terminals TP and TN are adapted to relay an external power dc source such as a converter 93 shown in FIG. 6, for example, with the power supply terminals P and N. In addition, the external terminals TU, TV and TW are adapted to relay an external load 94 with the output terminals U, V and W.

The converter 93 comprises diodes D1 to D6, and outputs a three-phase full wave rectified voltage by connecting a three-phase ac power source 92 to the input side. Therefore, the circuit substrate 80 is further loaded with a smoothing capacitive element 56 which is interposed between the external terminals TP and TN. Preferably, a smoothing capacitive element 57 is interposed also between the external terminals 84 and 89.

As clearly understood from the wiring diagram shown in FIG. 6, the capacitive elements 51 to 53 are connected to the three floating source terminals VD and the output terminals U, V and W respectively through the wiring patterns. This also applies to a case of employing the conventional device 150. Namely, the capacitive elements 51 to 53 are connected to the three floating source terminals VD and the three floating source terminals VS respectively through the wiring patterns also when the conventional device 150 is employed.

Also when the device 101 is replaced with the conventional device 150, therefore, it is not necessary to extend the area of the circuit substrate 80 for providing the capacitive elements 51 to 53 and the wiring patterns. Further, the area of the circuit substrate 80 can also be reduced due to the reduction of the area occupied by the device 101 following reduction of its terminals. Thus, the device 101 has an effect of miniaturizing not only the device 101 itself but the module 102 on which the same is mounted.

Embodiment 3

The device 101 according to the embodiment 1 is formed as a three-phase invertor. However, the characteristic structure of making the floating source pins VS in common with the output terminals and removing internal wires therebetween is not restricted to the three-phase invertor, but executable also on a general multi-phase invertor or a single-phase invertor. This is formed by properly increasing/reducing the number of circuit parts corresponding to the respective phases of the three-phase invertor shown in FIG. 1.

Further, the present invention is not restricted to the invertor but executable also on the so-called bridge circuit comprising a pair of series-connected switching elements which are alternately turned on and off. This bridge circuit is illustrated here.

Figure 7:
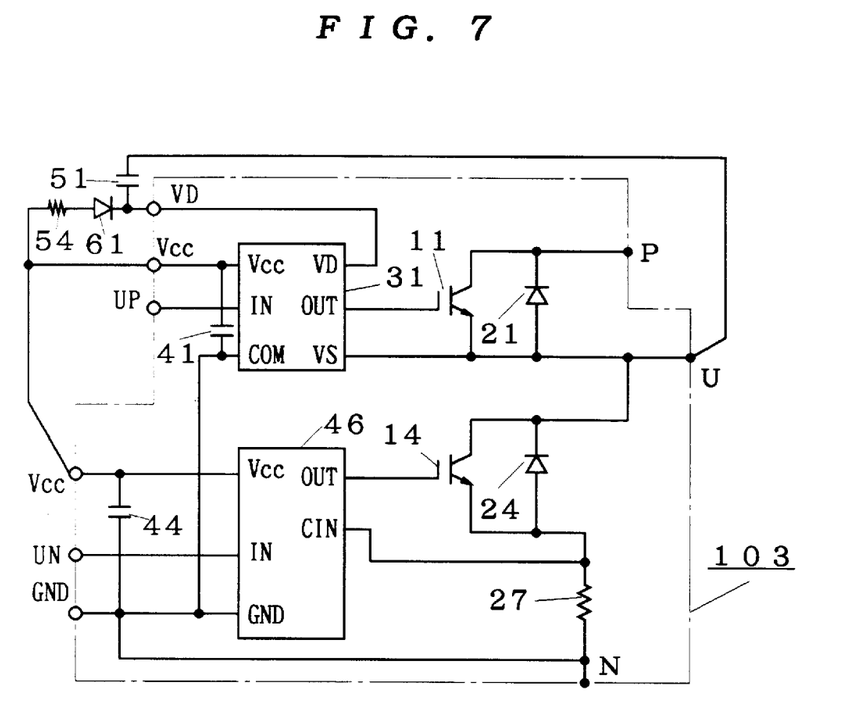
FIG. 7 is a circuit diagram of a semiconductor device according to an embodiment 3 of the present invention.

A semiconductor device 103 shown in a circuit diagram of FIG. 7 is formed as a bridge circuit. Referring to FIG. 7, parts which are identical to those of the device and the peripheral circuit shown in FIG. 1 are denoted by the same reference numerals, to omit redundant description. In this device 103, a pair of series-connected IGBTs 11 and 14 are interposed between power source terminals P and N. A sensing resistive element 27 is interposed between an emitter electrode of the IGBT 14 and the power source terminal N.

The device 103 further comprises control circuits 31 and 46 for controlling the IGBTs 11 and 14 respectively. The control circuit 46 is equivalent to one of the circuit parts 71 to 73, such as the circuit part 71, for example, in the circuit diagram shown in FIG. 3. Namely, the device 103 corresponds to a circuit for one phase of the device 101 serving as a three-phase invertor.

Also in this device 103, the floating source pins VS which have been provided in the conventional device 150 as well as the wiring patterns connecting the floating source pins VS with an output terminal U are removed. A capacitive element 51 which is included in the peripheral circuit is connected to a floating source terminal VD and the output terminal U. Therefore, miniaturization of the device is implemented, similarly to the device 101. Also in a semiconductor module (not shown) which is formed by combining the device 103 with its peripheral circuit in correspondence to the module 102, miniaturization is implemented similarly to the module 102.

Modification

While the IGBTs are employed as switching semiconductor elements in the aforementioned embodiments, the switching semiconductor elements are not restricted to the IGBTs but general insulated gate switching semiconductor elements including MOSFETs etc. may alternatively be employed. Further, the switching semiconductor elements are not restricted to insulated gate types, but may alternatively be prepared from wider switching semiconductor elements such as bipolar transistors, for example. In a device employing insulated gate switching semiconductor elements which are of a voltage driving type among these, capacitances of capacitive elements 51 to 53 can be suppressed and the structure of the driving circuits can be simplified.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

first and second series connected switching semiconductor elements;

first and second driving circuits for independently and respectively driving said first and second switching semiconductor elements, each of said first and second driving circuits having a pair of source electrodes, a first one of said pair of source electrodes of said first driving circuit being connected to a connecting part for said first and second switching semiconductor elements;

a plurality of terminals for connecting to an external device, said plurality of terminals including a first terminal connected to a second one of said pair of source electrodes of said first driving circuit and a second terminal connected to said connecting part, with no terminal of said plurality of terminals connected to said first one of said source electrodes of said first driving circuit except for said second terminal;

an electrically conductive lead frame, being in the form of a plate having a pattern shape, having said first and second switching semiconductor elements and said first and second driving circuits being fixed thereto and including said plurality of terminals in a peripheral portion thereof; and a sealing body sealing said first and second switching semiconductor elements and said first and second driving circuits along with said lead frame to expose said plurality of terminals.

2. A semiconductor device, comprising:

a plurality of unit semiconductor devices, each including, first and second series connected switching semiconductor elements, each having main electrodes, first and second driving circuits independently and respectively driving said first and second switching semiconductor elements and each having a pair of source electrodes, and a plurality of terminals for connecting to an external device, wherein a first one of pair of source electrodes of said first driving circuit is connected to a connecting part for said first and second switching semiconductor elements, said plurality of terminals include a first terminal connected to a second one of said pair of source electrodes of said first driving circuit and a second terminal connected to said connecting part, with no terminal of said plurality of terminals connected to said first one of said source electrodes of said first driving circuit except for said second terminal, said main electrodes of said first and second switching semiconductor elements excluding said connecting part are connected in parallel, and said semiconductor device further comprises:

an electrically conductive lead frame, being in the form of a plate having a pattern shape, having said first and second switching semiconductor elements and said first and second driving circuits being fixed thereto and including said plurality of terminals in a peripheral portion thereof; and a sealing body sealing said first and second switching semiconductor elements and said first and second driving circuits along with said lead frame to expose said plurality of terminals.

3. The semiconductor device in accordance with claim 2, wherein both of said first and second switching semiconductor elements are insulated gate switching semiconductor elements.

4. The semiconductor device in accordance with claim 3, further comprising:

a pulse generation circuit generating a pulse being based on potentials of a pair of source electrodes being provided in said second driving circuit in response to an external signal, and a level shifter inputting said pulse in said driving circuits while shifting its level.

5. The semiconductor device in accordance with claim 4, wherein said pulse generation circuit, said level shifter and said first driving circuit are built into a single semiconductor chip.

6. The semiconductor device in accordance with claim 5, wherein said insulated gate switching semiconductor devices are IGBTs.

7. The semiconductor device in accordance with claim 6, wherein said first and second switching semiconductor elements and said first and second driving circuits are fixed to one major surface of said lead frame, and said semiconductor device further comprises a heat-conductive heat sink being opposed to another major surface of said lead frame with a clearance therebetween, said sealing body also filling up said clearance.

8. A semiconductor module having a circuit substrate having wiring patterns, a semiconductor device disposed on said circuit substrate, and a plurality of circuit elements further disposed on said circuit substrate, wherein said semiconductor device comprises:

first and second series connected switching semiconductor elements, first and second driving circuits independently and respectively driving said first and second switching semiconductor elements, each of said first and second driving circuits having a pair of source electrodes, and a plurality of terminals for connecting to an external device, wherein a first one of said pair of source electrodes of said first driving circuit is connected to a connecting part for said first and second switching semiconductor elements, said plurality of terminals include a first terminal connected to a second one of said pair of source electrodes of said first driving circuit and a second terminal connected to said connecting part, with no terminal of said plurality of terminals connected to said first one of said source electrodes of said first driving circuit except for said second terminal, said plurality of terminals further include third and fourth terminals being connected to said pair of source electrodes of said second driving circuit respectively, and said semiconductor device further comprises:

an electrically conductive lead frame, being in the form of a plate having a pattern shape, having said first and second switching semiconductor elements and said first and second driving circuits being fixed thereto and including said plurality of terminals in a peripheral portion thereof; and a sealing body sealing said first and second switching semiconductor elements and said first and second driving circuits along with said lead frame to expose said plurality of terminals; and said plurality of circuit elements include:

a capacitive element being interposed between said first and second terminals, and a diode element being interposed between said third and first terminals in such a direction that a forward current charges said capacitive element.

9. The semiconductor module in accordance with claim 8, wherein said plurality of circuit elements further include a resistive element being connected in series with said diode element.

10. The semiconductor module in accordance with claim 9, further having heat radiation means being fixed to said semiconductor device.

* * * * *